and having a difference between transmittances at a wavelength of 400 nm before and after irradiation with ultraviolet ray of 2% or less.

(12) United States Patent
Murata

(10) Patent No.: US 8,497,220 B2
(45) Date of Patent: Jul. 30, 2013

(54) GLASS SUBSTRATE FOR SOLAR CELL

(75) Inventor: Takashi Murata, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 396 days.

(21) Appl. No.: 12/458,363

(22) Filed: Jul. 9, 2009

(65) Prior Publication Data

US 2009/0275462 A1 Nov. 5, 2009

Related U.S. Application Data

(63) Continuation-in-part of application No. PCT/JP2008/051589, filed on Jan. 31, 2008.

(30) Foreign Application Priority Data

Feb. 16, 2007 (JP) .................................. 2007-035723
Jan. 15, 2008 (JP) .................................. 2008-005159

(51) Int. Cl.
*C03C 3/091* (2006.01)
*C03C 3/085* (2006.01)
*C03C 3/087* (2006.01)

(52) U.S. Cl.
USPC ..................... 501/66; 501/68; 501/69; 501/70

(58) Field of Classification Search
USPC ........................................ 501/66, 68, 69, 70
See application file for complete search history.

(56) References Cited

U.S. PATENT DOCUMENTS

| | | | | |
|---|---|---|---|---|
| 5,322,819 | A * | 6/1994 | Araujo et al. ................... | 501/13 |
| 6,188,013 | B1 | 2/2001 | Inaba et al. | |
| 6,306,786 | B1 * | 10/2001 | Koyama et al. ................. | 501/69 |
| 6,376,403 | B1 * | 4/2002 | Koyama et al. ................. | 501/69 |
| 6,417,124 | B1 * | 7/2002 | Peuchert et al. ................ | 501/66 |
| 6,465,381 | B1 | 10/2002 | Lautenschlager et al. | |
| 6,468,933 | B1 * | 10/2002 | Narita et al. .................... | 501/56 |
| 6,508,083 | B1 * | 1/2003 | Naka et al. .................... | 65/134.3 |
| 6,680,266 | B1 * | 1/2004 | Peuchert et al. ................ | 501/66 |
| 6,707,526 | B2 * | 3/2004 | Peuchert et al. ............. | 349/158 |
| 6,852,658 | B2 * | 2/2005 | Peuchert et al. ................ | 501/67 |
| 6,858,552 | B2 * | 2/2005 | Peuchert ......................... | 501/66 |
| 6,867,158 | B2 * | 3/2005 | Peuchert et al. ................ | 501/67 |
| 6,881,692 | B2 * | 4/2005 | Murata et al. ................... | 501/66 |
| 6,992,030 | B2 * | 1/2006 | Paulson .......................... | 501/66 |
| 6,992,031 | B2 * | 1/2006 | Naumann et al. ............... | 501/69 |
| 7,153,797 | B2 * | 12/2006 | Peuchert ......................... | 501/66 |
| 2001/0034294 | A1 | 10/2001 | Peuchert et al. | |
| 2002/0183188 | A1 | 12/2002 | Peuchert | |
| 2003/0087746 | A1 * | 5/2003 | Ritter et al. .................... | 501/66 |
| 2004/0220039 | A1 | 11/2004 | Peuchert | |
| 2005/0026767 | A1 * | 2/2005 | Takase et al. ................... | 501/56 |
| 2005/0101469 | A1 * | 5/2005 | Peuchert et al. ................ | 501/66 |
| 2007/0232478 | A1 * | 10/2007 | Fechner et al. ................. | 501/66 |
| 2007/0243992 | A1 * | 10/2007 | Fechner et al. ................. | 501/66 |
| 2008/0020919 | A1 * | 1/2008 | Murata ........................... | 501/66 |
| 2009/0176640 | A1 * | 7/2009 | Maehara et al. ................ | 501/66 |
| 2009/0197088 | A1 * | 8/2009 | Murata ........................... | 428/410 |
| 2010/0047521 | A1 * | 2/2010 | Amin et al. .................... | 428/141 |
| 2010/0300536 | A1 * | 12/2010 | Aitken et al. ................. | 136/260 |

FOREIGN PATENT DOCUMENTS

| | | |
|---|---|---|
| DE | 100 05 088 | 3/2001 |
| JP | 10-324526 | 12/1998 |
| JP | 11-298030 | 10/1999 |
| JP | 2000-91601 | 3/2000 |
| JP | 2001-48573 | 2/2001 |
| JP | 2001-240427 | 9/2001 |
| JP | 2001-261366 | 9/2001 |
| JP | 2002-234752 | 8/2002 |
| JP | 2004-189535 | 7/2004 |
| JP | 2004-221541 | 8/2004 |
| JP | 2004-284949 | 10/2004 |

OTHER PUBLICATIONS

Machine translation of JP 2004-189535, Jul. 8, 2004.*
Machine translation of JP 2004-284949, Oct. 14, 2004.*
International Search Report issued Mar. 4, 2008 in PCT/JP2008/051589.
English translation of the International Preliminary Report on Patentability and Written Opinion.
Supplementary European Search Report issued Mar. 22, 2011 in European Application No. 08710687.8.

* cited by examiner

Primary Examiner — Karl Group
Assistant Examiner — Elizabeth A Bolden
(74) Attorney, Agent, or Firm — Wenderoth, Lind & Ponack, L.L.P.

(57) ABSTRACT

The glass substrate for a solar cell of the present invention is characterized by having a glass composition including, in terms of mass %, 50 to 80% of $SiO_2$, 5 to 20% of $Al_2O_3$, 0 to 20% of $B_2O_3$, 0 to 20% of MgO, 0 to 20% of CaO, 0 to 20% of SrO, 0 to 20% of BaO, 0.001 to 2% of $SnO_2$, 0 to 1% of $As_2O_3$, having a mass ratio $SnO_2/(Fe_2O_3+SnO_2)$ of 0.9 or more, and having a difference between transmittances at a wavelength of 400 nm before and after irradiation with ultraviolet ray of 2% or less.

11 Claims, No Drawings

US 8,497,220 B2

GLASS SUBSTRATE FOR SOLAR CELL

CROSS-REFERENCE TO RELATED APPLICATION

This is a continuation-in-part application of international application PCT/JP2008/051589 filed Jan. 31, 2008, and claiming the priorities of Japanese applications 2007-035723 filed Feb. 16, 2007 and 2008-005159 filed Jan. 15, 2008.

TECHNICAL FIELD

The present invention relates to a glass substrate for a solar cell, and in particular, the present invention relates to a glass substrate for a solar cell suitable for the use in a monocrystal silicon solar cell, a polycrystal silicon solar cell, an amorphous silicon solar cell, a thin-film solar cell, a thin-film compound solar cell, or the like.

BACKGROUND ART

A solar cell is a device which uses photovoltaic effect and directly converts light energy into electric power. At present, various solar cells using a compound semiconductor or the like as a raw material are being in practical use in addition to silicon solar cells.

A Si-crystal silicon solar cell has a structure in which solar cells are connected with each other by an interconnector via a resin such as ethylenevinylacetate (EVA) and are sandwiched between glass substrates. In a thin-film solar cell, a transparent electrode, p-type, i-type, and n-type semiconductors, an electrode, and the like are formed on a glass substrate. A thin-film compound solar cell has a structure in which an electrode layer, a photoelectric conversion layer, a buffer layer, and the like are formed on a glass substrate. Those solar cells each have a structure in which light is delivered to the cell or the photoelectric conversion layer via the glass substrate. Further, the glass substrate is used as a cover glass or a structure support (base).

DISCLOSURE OF THE INVENTION

Problems to be Solved by the Invention

In the case where a solar cell is used for a long period of time, discoloration (hereinafter referred to as solarization) occurs in a glass substrate by ultraviolet ray, which lowers the intensity of sunlight irradiating a solar cell device, and there is a problem that a desired photoelectric conversion efficiency cannot be obtained.

As a method of suppressing solarization of the glass, there is known a method involving adding $TiO_2$ to the glass composition. However, when a large amount of $TiO_2$ is contained in the glass composition, devitrification-proof of the glass deteriorates, and in addition, the glass is colored and a desired photoelectric conversion efficiency cannot be obtained. As a result, the above problem cannot be solved.

Further, in a thin-film compound solar cell, a glass substrate is subjected to heat treatment at high temperature at the time of forming a thin film, and thus, the glass substrate requires high heat resistance.

Consequently, it is a technical object of the present invention to provide a glass substrate for a solar cell, which is prevented from the occurrence of solarization and has high heat resistance while keeping devitrification-proof and high transmittance of the glass. Here, the term "glass substrate for a solar cell" includes both a cover glass for a solar cell and a structural support for a solar cell.

Patent Document 1: JP 11-298030 A
Patent Document 2: JP 2000-91601 A

Means for Solving the Problems

The inventors of the present invention have conducted various studies, and as a result, they have found that solarization of a glass can be suppressed by allowing a predetermined amount of $SnO_2$ to be contained in the glass composition and then regulating an $SnO_2/(SnO_2+Fe_2O_3)$ value to 0.9 or more in terms of mass ratio, and the inventors have also found that heat resistance and devitrification-proof of the glass are compatible with each other by allowing appropriate amounts of $SiO_2$, $Al_2O_3$, and $B_2O_3$ to be contained in the glass composition. Thus, those findings are proposed as the present invention.

That is, the above technical object has been solved by providing a glass substrate for a solar cell of the present invention, in which: a glass composition thereof in terms of mass % is regulated as follows: 50 to 80% of $SiO_2$; 5 to 20% of $Al_2O_3$; 0 to 20% of $B_2O_3$; 0 to 20% of MgO; 0 to 20% of CaO; 0 to 20% of SrO; 0 to 20% of BaO; and 0.001 to 2% of $SnO_2$; a mass ratio $SnO_2/(Fe_2O_3+SnO_2)$ is set to 0.9 or more; and a difference between transmittances at a wavelength of 400 nm before and after irradiation with ultraviolet ray is set to 2% or less. Here, the term "transmittance" refers to a value measured with a spectrophotometer by using a glass substrate having a plate thickness of 0.7 mm. Further, the phrase "difference between transmittances at a wavelength of 400 nm before and after irradiation with ultraviolet ray" refers to a changed amount of transmittances at a wavelength of 400 nm in the case where an ultraviolet ray having a wavelength of 185 nm (2.7 mW/cm$^2$) and an ultraviolet ray having a wavelength of 254 nm (13 mW/cm$^2$) are irradiated for 12 hours.

Second, the glass substrate for a solar cell of the present invention is characterized by having a glass composition including, in terms of mass %, 50 to 80% of $SiO_2$, 5 to 20% of $Al_2O_3$, 0 to 20% of $B_2O_3$, 0 to 20% of MgO, 0 to 20% of CaO, 0 to 20% of SrO, 0 to 20% of BaO, 0.001 to 2% of $SnO_2$, 0 to 1% of $As_2O_3$, having a mass ratio $SnO_2/(Fe_2O_3+SnO_2)$ of 0.9 or more, and having a difference between transmittances at a wavelength of 400 nm before and after irradiation with ultraviolet ray of 2% or less.

Third, the glass substrate for a solar cell of the present invention is characterized by having a glass composition including, in terms of mass %, 0 to 20% of a total amount of $Li_2O$, $Na_2O$, and $K_2O$.

Fourth, the glass substrate for a solar cell of the present invention is characterized by having a glass composition containing 500 ppm or less of $Fe_2O_3$.

Fifth, the glass substrate for a solar cell of the present invention is characterized by being substantially free of $As_2O_3$. Here, a phrase "be substantially free of $As_2O_3$" represents a case in which the content of $As_2O_3$ in the glass composition is 0.1% or less.

Sixth, the glass substrate for a solar cell of the present invention is characterized by having a transmittance of 90% or more at a plate thickness of 0.7 mm and at a wavelength of 400 nm to 1,000 nm.

Seventh, the glass substrate for a solar cell of the present invention is characterized by having a density of 2.8 g/cm$^3$ or less. Here, "density" denotes a value measured by a known Archimedes method.

Eighth, the glass substrate for a solar cell of the present invention is characterized by having a thermal expansion coefficient at 30 to 380° C. of 5 to $100 \times 10^{-7}/°$ C. Here, "thermal expansion coefficient at 30 to 380° C." denotes a value obtained by measuring an average thermal expansion coefficient in the temperature range of 30 to 380° C. using a dilatometer.

Ninth, the glass substrate for a solar cell of the present invention is characterized by having a strain point of 500° C. or higher. Here, the term "strain point" denotes a value measured according to ASTM C336.

Tenth, the glass substrate for a solar cell of the present invention is characterized by having a liquidus viscosity of $10^{4.0}$ dPa·s or more. Here, the term "liquidus viscosity" denotes the viscosity of glass at the liquidus temperature measured by a platinum sphere pull up method. Here, glass is ground, and a glass powder passing through a standard sieve of 30 mesh (mesh opening 500 µm) and remaining on 50 mesh (mesh opening 300 µm) is placed in a platinum boat, and kept in a temperature gradient furnace for 24 hours, and then, the crystal thereof deposits. The temperature measured at the time of the deposition is referred to as "liquidus temperature". When the liquidus temperature of glass is lower and the liquidus viscosity of glass is higher, the devitrification-proof of glass is better and formability of a glass substrate is better.

Eleventh, the glass substrate for a solar cell of the present invention is characterized by having a Young's modulus of 68 GPa or more. Here, the term "Young's modulus" denotes a value measured by a resonance method.

Twelfth, the glass substrate for a solar cell of the present invention is characterized by being formed by an overflow down draw method.

BEST MODE FOR CARRYING OUT THE INVENTION

The reason for limiting the glass composition to the above-mentioned range in the glass substrate for a solar cell of the present invention is described below. Note that, unless otherwise mentioned, "%" used below means "mass %".

$SiO_2$ is a component forming a network of glass, and content thereof is 50 to 80%, preferably 55 to 75%, more preferably 55 to 70%, and still more preferably 55 to 65%. When the content of $SiO_2$ becomes larger, the viscosity at high temperature of the glass becomes higher, the meltability of the glass becomes deteriorated, and devitrified stone of cristobalite is easily precipitated. On the other hand, when the content of $SiO_2$ becomes smaller, the weatherability of the glass deteriorates and vitrification is not easily proceeded.

$Al_2O_3$ is a component which enhances a strain point and Young's modulus of the glass and suppresses the deposition of a devitrified stone of cristobalite. The content thereof is 5 to 20%, preferably 7 to 19%, more preferably 9 to 18%, still more preferably 11 to 17%, and most preferably 13 to 17%. When the content of $Al_2O_3$ becomes large, the liquidus temperature of the glass is raised and it becomes difficult to form the glass substrate. Further, when the content of $Al_2O_3$ becomes small, there are tendencies that the strain point and the Young's modulus of the glass lower, the viscosity at high temperature thereof becomes high, and the meltability deteriorates.

$B_2O_3$ is a component which serves as a flux, decreases the viscosity of the glass, and improves the meltability. The content thereof is 0 to 20%, preferably 5 to 20%, more preferably 7 to 15%, still more preferably 8 to 13%, still further preferably 8 to 12%, and most preferably 8 to 11%. When the content of $B_2O_3$ becomes large, there are tendencies that the strain point and the Young's modulus of the glass lower and the weatherability thereof deteriorates. Further, when the content of $B_2O_3$ becomes small, there are tendencies that the liquidus temperature of the glass is raised and it becomes difficult to form the glass substrate, and in addition, the viscosity at high temperature of the glass becomes high and the meltability of the glass deteriorates.

MgO is a component which lowers only the viscosity at high temperature of the glass without lowering the strain point thereof, and improves the meltability of the glass. The content thereof is 0 to 20%, preferably 0 to 7%, more preferably 0 to 5%, still more preferably 0 to 3%, and most preferably 0 to 2%. When the content of MgO becomes large, the liquidus temperature of the glass is raised and it becomes difficult to form the glass substrate, the thermal expansion coefficient of the glass increases too much and matching of the thermal expansion coefficient with those of peripheral materials becomes difficult, and the density of the glass tends to increase. Further, when the content of MgO becomes small, the strain point and the Young's modulus of the glass lower. Also the viscosity at high temperature thereof becomes high, which makes the melting of the glass difficult.

CaO is a component which lowers only the viscosity at high temperature of the glass without lowering the strain point thereof, and improves the meltability of the glass. The content thereof is 0 to 20%, preferably 0 to 12%, more preferably 3 to 10%, and still more preferably 3 to 9%. When the content of CaO becomes large, the liquidus temperature of the glass is raised and it becomes difficult to form the glass substrate, the thermal expansion coefficient of the glass increases too much and matching of the thermal expansion coefficient with those of peripheral materials becomes difficult, and the density of the glass increases. Further, when the content of CaO becomes small, the strain point and the Young's modulus of the glass lower. Also the viscosity at high temperature thereof becomes high, which makes the melting of the glass difficult.

SrO is a component which lowers only the viscosity at high temperature of the glass without lowering the strain point thereof, and improves the meltability of the glass. The content thereof is 0 to 20%, preferably 0 to 9%, more preferably 0.5 to 8%, and still more preferably 0.5 to 7%. When the content of SrO becomes large, the liquidus temperature of the glass is raised and it becomes difficult to form the glass substrate, the thermal expansion coefficient of the glass increases too much and matching of the thermal expansion coefficient with those of peripheral materials becomes difficult, and the density of the glass may increase. Further, when the content of SrO becomes small, the strain point and the Young's modulus of the glass lower and the viscosity at high temperature thereof becomes high, which makes the melting of the glass difficult.

BaO is a component which lowers only the viscosity at high temperature of the glass without lowering the strain point thereof, and improves the meltability of the glass. The content thereof is 0 to 20%, preferably 0 to 8%, more preferably 0 to 5%, and still more preferably 0 to 3%. When the content of BaO becomes large, the liquidus temperature of the glass is raised and it becomes difficult to form the glass substrate, the thermal expansion coefficient of the glass increases too much and matching of the thermal expansion coefficient with those of peripheral materials becomes difficult, and the density of the glass may increase. Further, when the content of BaO becomes small, the strain point and the Young's modulus of the glass lower and the viscosity at high temperature thereof becomes high, which makes the melting of the glass difficult.

MgO, CaO, SrO, and BaO, which are alkaline earth metal oxides, can be mixed and added to the glass composition to thereby improve the meltability and the devitrification-proof of the glass. However, when the content thereof becomes large, the density of the glass tends to increase, which makes it difficult to reduce the weight of the glass substrate. Further, there is a case where the thermal expansion coefficient becomes too high. Therefore, it is desirable that the total amount of the alkaline earth metal oxides be 0 to 30%, preferably 0 to 20%, more preferably 0 to 15%, and still more preferably 0 to 10%.

$SnO_2$ has an effect of controlling solarization of the glass as well as serving as a fining agent. The content thereof is 0.001 to 2%, preferably 0.005 to 1.5%, more preferably 0.01 to 1%, still more preferably 0.05 to 0.5%, and most preferably 0.05 to 0.3%. When the content of $SnO_2$ becomes large, the devitrification-proof of the glass deteriorates. Further, when the content of $SnO_2$ becomes small, the effect of suppressing the solarization of the glass becomes poor and the fining effect thereof decreases. Note that a raw material containing $SnO_2$ as a main component may be used as an $SnO_2$ introduction source, and it is not problematic that $SnO_2$ may be introduced from a trace component contained in another raw material or by an elution from an electrode.

In order to express more effectively the controlling the solarization of the glass, the value of a mass ratio $SnO_2/(Fe_2O_3+SnO_2)$ may be regulated to 0.9 or more, and preferably 0.92 or more, 0.94 or more, or 0.96 or more. When the value of the mass ratio $SnO_2/(Fe_2O_3+SnO_2)$ is less than 0.9, it becomes difficult to obtain a desired solarization-suppressing effect, and hence the photoelectric conversion efficiency of a solar cell is easily deteriorated with time.

$Fe_2O_3$ is a component which has an influence on transmittance of the glass. The content thereof is 0 to 0.05%, preferably 1 ppm to 0.03%, more preferably 0.005 to 0.02%, and most preferably 0.005 to 0.015%. When the content of $Fe_2O_3$ becomes large, the transmittance of the glass in the visible range is lowered too much, and hence the amount of sunlight irradiating a solar cell device is decreased and the solarization easily occurs. As a result, the photoelectric conversion efficiency of a solar cell is easily lowered. Further, when the content of $Fe_2O_3$ becomes small, there is a need to use a glass raw material having high purity, which brings about rising production cost of the glass substrate. Further, when the content of $Fe_2O_3$ becomes small, the transmittance in the ultraviolet range becomes too high, and the resin present on the glass substrate is deteriorated, which may shorten the lifetime of the solar cell.

Further, other components other than the above components can be contained in the glass composition in a total amount of up to 10%, if required.

$TiO_2$ is a component having an effect of suppressing the solarization of the glass, and the content thereof can be 0 to 10% (preferably 0 to 5%, more preferably 0 to 3%, still more preferably 0.001 to 1%, and most preferably 0.005 to 0.1%). As mentioned above, when the content of $TiO_2$ becomes large, the devitrification-proof of the glass deteriorates and the glass is colored.

ZnO is a component which increases the Young's modulus of the glass and improves the meltability of the glass, and the content thereof can be 0 to 10% (preferably 0 to 5%, more preferably 0 to 3%, still more preferably 0 to 1%, and most preferably 0 to 0.5%). When the content of ZnO becomes large, the density and the thermal expansion coefficient of the glass may become high. Further, when the content of ZnO becomes large, the devitrification-proof and the strain point of the glass tend to decrease.

$ZrO_2$ is a component which improves the weatherability of the glass, and the content thereof can be 0 to 2% (preferably 0 to 1%, more preferably 0 to 0.5%, still more preferably 0 to 0.2%, and most preferably 0 to 0.1%). When the content of $ZrO_2$ becomes large, a devitrified stone of zircon is easily deposited.

$As_2O_3$ is a component which serves as a fining agent of the glass, but when a large amount thereof is contained in the glass composition, the solarization of the glass is easily occurred, and hence the photoelectric conversion efficiency of a solar cell is easily deteriorated with time. Therefore, the content thereof is 0 to 1%, preferably 0 to 0.8%, more preferably 0 to 0.5%, and still more preferably 0 to 0.3%, and it is most preferred that the glass be substantially free of $As_2O_3$. Further, the glass composition which is substantially free of $As_2O_3$ can satisfy environmental requirements in recent years.

$Sb_2O_3$ is a component which serves as a fining agent of the glass, and the content thereof can be 0 to 2% (preferably 0 to 1.5%, more preferably 0 to 1%, still more preferably 0 to 0.5%, and most preferably 0 to 0.1%). When the content of $Sb_2O_3$ becomes large, the density of the glass is easily increased.

A halide containing Cl, F, or the like is a component which serves as a fining agent of the glass, and the content thereof can be 0 to 1% (preferably 0 to 0.5%, more preferably 0 to 0.1%, still more preferably 0 to 0.01%, and most preferably 0 to 0.001%). When the content of Cl is large, the volatilization amount of the component from a glass melt becomes large, so that striae on the glass tends to be formed or the properties of a solar cell device may be deteriorated.

$Li_2O$, $Na_2O$, and $K_2O$ are components which adjust the thermal expansion coefficient and lower the viscosity at high temperature. The content thereof can be 0 to 20% (preferably 0 to 5%, more preferably 0 to 1%, and most preferably 0 to 0.1%). When the content of those components becomes large, the strain point is lowered and the heat resistance is deteriorated. Further, when the content of those components becomes large, the thermal expansion coefficient becomes too large, and matching of the thermal expansion coefficient with those of a metal, an organic adhesive, and the like becomes difficult. In addition, when the content of those components becomes large, and in the case where those components are diffused in a film formed on the glass substrate, desired film properties may not be obtained.

Rare earth oxides such as $Nb_2O_5$ and $La_2O_3$ are components which enhance the Young's modulus of glass. However, the cost of the raw material of the rare earth oxides itself is high, and when the rare earth oxides are contained in a large amount, the devitrification-proof deteriorates. Therefore, it is desirable that the content thereof be limited to 3% or less, 2% or less, or 1% or less, and particularly 0.5% or less.

The glass substrate for a solar cell of the present invention preferably satisfies the following properties.

In the glass substrate for a solar cell of the present invention, a difference between transmittances at a wavelength of 400 nm before and after irradiation with ultraviolet ray is 2% or less, preferably 1.5% or less, more preferably 1% or less, and still more preferably 0.5% or less. When the difference between transmittances is smaller, the solarization of the glass can be suppressed, and the photoelectric conversion efficiency of a solar cell can be maintained for a long period of time.

In the glass substrate for a solar cell of the present invention, a transmittance at a wavelength of 400 nm to 1,000 nm is preferably 90% or more. When the transmittance at a wavelength of 400 nm to 1,000 nm is less than 90%, the photoelectric conversion efficiency of a solar cell is easily lowered.

In the glass substrate for a solar cell of the present invention, the glass density is preferably 2.8 g/cm$^3$ or less, 2.7 g/cm³ or less, 2.6 g/cm³ or less, 2.55 g/cm³ or less, 2.5 g/cm³ or less, or 2.45 g/cm³ or less, and particularly preferably 2.4 g/cm³ or less. When the glass density is smaller, the weight of the glass substrate can be reduced more.

In the glass substrate for a solar cell of the present invention, the glass thermal expansion coefficient in the temperature range of 30 to 380° C. is preferably 25 to $10\times10^{-7}$/° C., more preferably 25 to $80\times10^{-7}$/° C., still more preferably 25 to $70\times10^{-7}$/° C., still more preferably 28 to $60\times10^{-7}$/° C., particularly preferably 28 to $50\times10^{-7}$/° C., and most preferably 30 to $40\times10^{-7}$/° C. When the glass thermal expansion coefficient is set within the above-mentioned ranges, the glass thermal expansion coefficient tends to match those of members such as metals and organic adhesives. Therefore, peeling of the members such as metals and organic adhesives can be prevented.

In the glass substrate for a solar cell of the present invention, the strain point of the glass as an index of the heat resistance of the glass is preferably 500° C. or higher (more preferably 550° C. or higher, still more preferably 600° C. or higher, and particularly preferably 630° C. or higher). When the strain point is higher, the heat resistance of the glass becomes higher, which makes it difficult to cause thermal deformation or thermal shrinkage in the glass substrate during film forming process of a thin-film compound solar cell or the like.

In the glass substrate for a solar cell of the present invention, the temperature at the viscosity of $10^{2.5}$ dPa·s is preferably 1,700° C. or lower, more preferably 1,650° C. or lower, still more preferably 1,600° C. or lower, and particularly preferably 1,550° C. or lower. When the temperature at the viscosity of $10^{2.5}$ dPa·s is lower, burden on a glass production facility such as a melting furnace is smaller, and the bubble quality of the glass substrate can be further improved. Therefore, when the temperature at the viscosity of $10^{2.5}$ dPa·s is lower, the glass substrate can be produced at lower cost. It should be noted that the temperature at the viscosity of $10^{2.5}$ dPa·s corresponds to the glass melting temperature, and when the temperature at the viscosity of $10^{2.5}$ dPa·s is lower, the glass can be melted at lower temperature.

In the glass substrate for a solar cell of the present invention, it is preferred that the liquidus temperature of glass is 1,200° C. or lower, 1,150° C. or lower, 1,120° C. or lower, 1,100° C. or lower, or 1,090° C. or lower, and particularly 1,070° C. or lower. When the liquidus temperature of glass is lower, the glass is not devitrified easily during forming by an overflow down draw method and the like.

In the glass substrate for a solar cell of the present invention, the liquidus viscosity of glass is preferably $10^{4.0}$ dPa·s or more, $10^{4.5}$ dPa·s or more, $10^{5.0}$ dPa·s or more, $10^{5.3}$ dPa·s or more, $10^{5.5}$ dPa·s or more, and particularly preferably $10^{5.7}$ dPa·s or more. When the liquidus viscosity of glass is larger, the glass is not devitrified easily during forming by an overflow down draw method and the like.

In the glass substrate for a solar cell of the present invention, the glass Young's modulus is preferably 68 GPa or more, more preferably 69 GPa or more, and still more preferably 70 GPa or more. When the glass Young's modulus is higher, the glass substrate does not bend easily.

In the glass substrate for a solar cell of the present invention, the specific modulus is preferably 27 GPa/(g/cm³) or more, more preferably 28 GPa/(g/cm³) or more, still more preferably 29 GPa/(g/cm³) or more, and particularly preferably 30 GPa/(g/cm³) or more. When the specific modulus is higher, Sag of the glass substrate due to its own weight is decreased more. As a result, when glass substrates are accommodated in a cassette and the like, the clearance between the glass substrates can be decreased, leading to the improvement in productivity of the solar cell.

It is preferred that the glass substrate for a solar cell of the present invention have a plate thickness of 3.0 mm or less, 2.0 mm or less, 1.5 mm or less, 0.7 mm or less, or 0.5 mm or less, and particularly 0.05 to 0.3 mm or 0.1 to 0.3 mm. When the plate thickness of the glass substrate is smaller, the weight of the glass substrate can be further reduced. It should be noted that when the plate thickness of the glass substrate is 0.05 mm or less, the production efficiency of the glass substrate is reduced.

It is preferred that the glass substrate for a solar cell of the present invention have an unpolished surface. The theoretical strength of glass is essentially very high, but the breakage of glass often occurs even with a stress which is by far lower than the theoretical strength. This phenomenon occurs because a small defect called Griffith flaw is generated on the surface of the glass substrate in a process after forming of the glass, for example, in a polishing process. Therefore, when the surface of the glass substrate is not polished, the original mechanical strength of the glass substrate is not lowered easily, and the glass substrate is not broken easily. Further, when the surface of the glass substrate is not polished, a polishing process can be omitted in a glass substrate production process, and thus, the production cost of the glass substrate can be decreased. In the glass substrate for a solar cell of the present invention, if the both whole surfaces of the glass substrate are not polished, the glass substrate becomes more difficult to break. In the glass substrate for a solar cell of the present invention, a chamfering process and the like may be performed on the cut surface of the glass substrate to prevent breakage from occurring starting from the cut surface of the glass substrate. In particular, a cover glass for a solar cell is placed so that the cover glass faces the sun, and hence, the cover glass preferably has an unpolished surface in order to improve the properties such as impact resistance.

The glass substrate for a solar cell of the present invention can be produced by feeding, in a continuous melting furnace, a glass raw material which is prepared to have a desired glass composition, melting the glass raw material by heating at 1,500 to 1,600° C., fining the resultant, feeding the resultant to a forming apparatus, forming the molten glass into a plate shape, and gradually cooling the resultant.

As the method of forming the glass substrate for a solar cell of the present invention, various methods can be adopted. For example, there can be adopted various forming methods such as an overflow down draw method, a float method, a slot down method, a re-draw method, a roll out method, and a press method.

It is preferred that the glass substrate for a solar cell of the present invention be obtained by being formed by the overflow down draw method. When the glass substrate is formed by the overflow down draw method, a glass substrate which is not polished and has an excellent surface quality can be produced. The reason for this is as follows: in the case of adopting the overflow down draw method, the surface to be the surface of the glass substrate does not come in direct contact with a trough-shaped refractory, and is formed in the form of free surface, and hence, a glass substrate which is not polished and has excellent surface quality can be formed. Here, the overflow down draw method is a method in which glass in a molten condition is allowed to overflow from both sides of a heat-resistant trough-shaped structure, and the overflown molten glass is subjected to draw-forming downwardly while the molten glass is joined at the lower end of the trough-shaped structure, to thereby produce a glass substrate. The structure and material of the trough-shaped structure are not particularly limited as long as they provide desired size and surface precision of the glass substrate and can realize quality usable in the glass substrate. Further, any method may be used to apply force to the glass substrate to perform downward draw forming. For example, there may be adopted a method involving rotating a heat resistant roll having sufficiently large width in the state of being in contact with the glass substrate, to thereby draw the glass substrate, and a method involving allowing several pairs of heat resistant rolls to come into contact with only a portion close to end surfaces of the glass substrate to thereby draw the glass substrate. The glass according to the present invention is excellent in devitrification-proof and has a viscosity property suitable for forming, and thus, forming by the overflow down draw method can be carried out with good precision by using the glass according to the present invention. When the liquidus temperature is 1,200° C. or lower and the liquidus viscosity is $10^{4.0}$ dPa·s or more, the glass substrate can be produced by the overflow down draw method.

EXAMPLE

The present invention is hereinafter described based on examples.

Tables 1 to 2 show examples of the present invention (sample Nos. 1 to 6) and comparative examples of the present invention (sample Nos. 7 and 13).

TABLE 1

| | | Example | | | | | |
|---|---|---|---|---|---|---|---|
| | | 1 | 2 | 3 | 4 | 5 | 6 |
| Glass composition (mass %) | $SiO_2$ | 59.618 | 58.230 | 58.714 | 61.554 | 59.626 | 60.47 |
| | $Al_2O_3$ | 15.2 | 16.2 | 14.9 | 15.9 | 16.5 | 15.7 |
| | $B_2O_3$ | 9.7 | 8.3 | 10.3 | 7.6 | 10.3 | 10.8 |
| | MgO | 0 | 0.6 | 0.5 | 2.7 | 0.3 | 0.3 |
| | CaO | 5.3 | 4.0 | 4.4 | 8.4 | 8.0 | 8.0 |
| | SrO | 6.2 | 1.8 | 3.3 | 0 | 4.5 | 4.5 |
| | BaO | 2.2 | 8.9 | 5.6 | 3.4 | 0.5 | 0 |
| | ZnO | 0.4 | 0 | 0 | 0 | 0 | 0 |
| | $As_2O_3$ | 0 | 0 | 0 | 0 | 0 | 0 |
| | $Sb_2O_3$ | 1.00 | 1.79 | 2.15 | 0 | 0 | 0 |
| | $SnO_2$ | 0.19 | 0.17 | 0.08 | 0.33 | 0.22 | 0.20 |
| | $ZrO_2$ | 0.170 | 0 | 0.053 | 0.100 | 0.042 | 0 |
| | $Fe_2O_3$ | 0.012 | 0.010 | 0.003 | 0.011 | 0.0117 | 0.01 |
| | $TiO_2$ | 0.01 | 0 | 0 | 0.005 | 0 | 0 |
| $SnO_2/(SnO_2+Fe_2O_3)$ | | 0.94 | 0.94 | 0.96 | 0.97 | 0.95 | 0.96 |
| Density [g/cm$^3$] | | 2.50 | 2.54 | 2.50 | 2.48 | 2.46 | 2.45 |
| Thermal expansion coefficient [×10$^{-7}$/° C.] | | 37 | 37 | 37 | 38 | 38 | 37 |
| Strain point [° C.] | | 650 | 659 | 640 | 652 | 645 | 642 |
| Slow cooling point [° C.] | | 710 | 719 | 698 | 706 | 722 | 704 |
| Softening point [° C.] | | 955 | 971 | 950 | 939 | 954 | 939 |
| $10^4$ [° C.] | | 1,280 | 1,317 | 1,294 | 1,262 | 1,268 | 1,260 |
| $10^3$ [° C.] | | 1,460 | 1,486 | 1,464 | 1,420 | 1,428 | 1,425 |
| $10^{2.5}$ [° C.] | | 1,560 | 1,595 | 1,573 | 1,523 | 1,532 | 1,534 |
| Liquidus temperature [° C.] | | 1,060 | 1,050 | — | 1,190 | 1,084 | 1,085 |
| Liquidus viscosity [° C.] | | 6 | 6.5 | — | 4.6 | 5.8 | 5.6 |
| Young's modulus [GPa] | | 70 | 70 | 69 | 78 | 73 | 73 |
| Specific modulus [GPa/(g/cm$^3$)] | | 28.0 | 27.5 | 27.7 | 31.4 | 29.7 | 29.9 |
| Crack generation ratio [%] | | 0 | — | — | 0 | — | — |
| Transmittance [%] | Before irradiation | $T_{400}$ | 91.4 | 91.2 | 91.2 | 91.3 | 91.9 | 91.8 |
| | | $T_{550}$ | 92.0 | 91.8 | 91.7 | 91.8 | 92.5 | 92.4 |
| | | $T_{1000}$ | 92.6 | 92.5 | 92.7 | 92.3 | 92.6 | 92.5 |
| | After irradiation | $t_{400}$ | 90.5 | 90.4 | 90.9 | 89.8 | 91.0 | 90.9 |
| | | $t_{550}$ | 91.8 | 91.7 | 91.8 | 91.4 | 92.4 | 92.4 |
| | | $t_{1000}$ | 92.6 | 92.5 | 92.8 | 92.4 | 92.5 | 92.5 |
| | $T_{400} - t_{400}$ | | 0.9 | 0.8 | 0.3 | 1.5 | 0.9 | 0.9 |

TABLE 2

| | | Comparative Example | | | | | | |
|---|---|---|---|---|---|---|---|---|
| | | 7 | 8 | 9 | 10 | 11 | 12 | 13 |
| Glass composition (mass %) | $SiO_2$ | 59.067 | 57.707 | 63.476 | 59.683 | 58.935 | 63.694 | 63.357 |
| | $Al_2O_3$ | 14.9 | 16.3 | 15.6 | 14.9 | 17.0 | 16.0 | 15.6 |
| | $B_2O_3$ | 10.8 | 8.4 | 10.7 | 9.7 | 7.9 | 10.3 | 10.2 |
| | MgO | 0.4 | 1.0 | 0 | 0 | 4.0 | 0.1 | 1.9 |
| | CaO | 4.6 | 4.1 | 7.5 | 5.5 | 4.0 | 7.8 | 6.1 |
| | SrO | 3.1 | 1.9 | 0.9 | 6.0 | 7.7 | 0.8 | 1.8 |
| | BaO | 6.2 | 9.5 | 0.5 | 2.4 | 0.3 | 0 | 0 |
| | ZnO | 0 | 0 | 0 | 0.4 | 0 | 0 | 0 |
| | $As_2O_3$ | 0.86 | 1.01 | 0.70 | 0.69 | 0 | 1.10 | 0.97 |
| | $Sb_2O_3$ | 0 | 0.01 | 0.53 | 0.31 | 0 | 0.01 | 0 |
| | $SnO_2$ | 0 | 0.06 | 0.01 | 0.09 | 0 | 0.17 | 0 |
| | $ZrO_2$ | 0.070 | 0.001 | 0.060 | 0.300 | 0.100 | 0.003 | 0.068 |
| | $Fe_2O_3$ | 0.003 | 0.012 | 0.014 | 0.017 | 0.065 | 0.023 | 0.005 |
| | $TiO_2$ | 0 | 0 | 0.01 | 0.01 | 0 | 0 | 0 |

TABLE 2-continued

|  |  |  | Comparative Example | | | | | | |
|---|---|---|---|---|---|---|---|---|---|
|  |  |  | 7 | 8 | 9 | 10 | 11 | 12 | 13 |
| $SnO_2/(SnO_2+Fe_2O_3)$ | | | 0 | 0.83 | 0.42 | 0.84 | 0 | 0.88 | 0 |
| Density [g/cm³] | | | 2.48 | 2.55 | 2.39 | 2.49 | 2.50 | 2.37 | 2.39 |
| Thermal expansion coefficient [×10⁻⁷/° C.] | | | 37 | 37 | 32 | 37 | 37 | 32 | 32 |
| Strain point [° C.] | | | 642 | 657 | 665 | 650 | 667 | 664 | 657 |
| Slow cooling point [° C.] | | | 699 | 718 | 735 | 710 | 721 | 724 | 714 |
| Softening point [° C.] | | | 951 | 969 | 985 | 955 | 953.5 | 983 | 969 |
| $10^4$ [° C.] | | | 1,301 | 1,307 | 1,325 | 1,280 | 1,272 | 1,322 | 1,299 |
| $10^3$ [° C.] | | | 1,472 | 1,479 | 1,500 | 1,460 | 1,431 | 1,494 | 1,467 |
| $10^{2.5}$ [° C.] | | | 1,584 | 1,592 | 1,610 | 1,560 | 1,533 | 1,603 | 1,574 |
| Liquidus temperature [° C.] | | | 1,045 | — | 1,105 | 1,060 | 1,134 | 1,105 | 1,125 |
| Liquidus viscosity [° C.] | | | 6.3 | — | 6 | 6 | 5.2 | 6 | 5.6 |
| Young's modulus [GPa] | | | 69 | 70 | 70 | 70 | 77 | 70 | 73 |
| Specific modulus [GPa/(g/cm³)] | | | 27.8 | 27.5 | 29.3 | 28.1 | 30.8 | 29.5 | 30.6 |
| Crack generation ratio [%] | | | — | — | 0 | 0 | — | — | — |
| Transmittance [%] | Before irradiation | $T_{400}$ | 91.6 | 91.0 | 91.5 | 91.2 | 90.8 | 91.2 | 91.7 |
|  |  | $T_{550}$ | 92.0 | 91.8 | 92.2 | 91.9 | 91.7 | 92.2 | 92.2 |
|  |  | $T_{1000}$ | 92.9 | 92.6 | 93.0 | 92.6 | 91.0 | 92.8 | 93.2 |
|  | After irradiation | $t_{400}$ | 89.1 | 87.4 | 88.8 | 89.1 | 86.6 | 87.9 | 88.4 |
|  |  | $t_{550}$ | 91.4 | 91.1 | 91.7 | 91.5 | 90.9 | 91.6 | 91.4 |
|  |  | $t_{1000}$ | 92.9 | 92.7 | 93.1 | 92.6 | 90.9 | 92.7 | 93.1 |
| $T_{400} - t_{400}$ | | | 2.5 | 3.6 | 2.7 | 2.1 | 4.2 | 3.3 | 3.3 |

Each of the samples was produced as described below. First, a glass raw material was prepared so as to have a glass composition shown in Tables 1 to 2, and the raw material was melted at 1,600° C. for 24 hours using a platinum pot. Thereafter, the molten glass was cast on a carbon plate and formed into a plate shape. Various properties were evaluated for the resultant glass plate.

The density was measured by a known Archimedes method.

The thermal expansion coefficient is an average thermal expansion coefficient measured in the range of 30 to 380° C. using a dilatometer.

The strain point Ps and the annealing point Ta were measured based on a method of ASTM C336.

The softening point Ts was measured based on a method of ASTM C338.

Temperatures at glass viscosities of $10^{4.0}$ dPa·s, $10^{3.0}$ dPa·s, and $10^{2.5}$ dPa·s were measured by a platinum sphere pull up method.

The liquidus temperature is as follows: glass is ground, and glass powders which pass through a standard sieve of 30 mesh (mesh opening 500 μm) and remain on 50 mesh (mesh opening 300 μm) are placed in a platinum boat, and kept in a temperature gradient furnace for 24 hours, and then, the crystal thereof deposits, and the temperature measured at the time of the deposition is referred to as the liquidus temperature.

As for the liquidus viscosity, the viscosity of the glass at the liquidus temperature was measured by a platinum-ball lifting method.

The Young's modulus was measured by a resonance method.

The specific modulus was calculated by dividing the Young's modulus by the density.

The transmittance and the difference between the transmittances were measured as follows. A glass having a thickness of 0.7 mm is produced, and then transmittances at wavelengths of 400 nm, 550 nm, and 1,000 nm (referred to as $T_{400}$, $T_{550}$, and $T_{1000}$, respectively) are measured by a spectrophotometer UV-3100PC manufactured by Shimadzu Corporation. Next, by using a low-pressure mercury lamp, a sample is irradiated with an ultraviolet ray having a wavelength of 185 nm (2.7 mW/cm²) and an ultraviolet ray having a wavelength of 254 nm (13 mW/cm²) for 12 hours. After the irradiation with the ultraviolet rays, transmittances at wavelengths of 400 nm, 550 nm, and 1,000 nm (referred to as $t_{400}$, $t_{550}$, and $t_{1000}$, respectively) are measured by the spectrophotometer UV-3100PC manufactured by Shimadzu Corporation. Finally, the difference between the transmittances $T_{400}-t_{400}$ is determined.

As a result, the glass substrates of Nos. 1 to 6 according to examples each had a difference between transmittances $T_{400}-t_{400}$ at a wavelength of 400 nm of 1.5% or less and a transmittance at a wavelength of 400 nm to 1,000 nm of 90% or more. Further, the glass substrates of Nos. 1 to 6 each had a strain point of 640° C. or higher, a thermal expansion coefficient of 37 to 38×10⁻⁷/° C., a density of 2.54 g/cm³ or less, a Young's modulus of 69 GPa or more, a liquidus temperature of 1,190° C. or lower, and a liquidus viscosity of $10^{4.6}$ dPa·s or more.

On the other hand, the glass substrates of Nos. 7 to 13 according to comparative examples each had an $SnO_2/(SnO_2+Fe_2O_3)$ ratio of less than 0.90, and thus, the glass substrates of Nos. 7 to 13 each had a difference between transmittances $T_{400}-t_{400}$ at a wavelength of 400 nm of 2.1% or more.

INDUSTRIAL APPLICABILITY

As described above, the glass substrate for a solar cell of the present invention is suitable as a cover glass for a solar cell and a structure support for a solar cell. Further, the glass substrate for a solar cell of the present invention is suitable for the use in a monocrystal silicon solar cell, a polycrystal silicon solar cell, an amorphous silicon solar cell, a thin-film solar cell, a thin-film compound solar cell, or the like.

The invention claimed is:

1. A glass substrate for a solar cell, which has a glass composition comprising, in terms of mass %, 50 to 80% of $SiO_2$, 5 to 20% of $Al_2O_3$, 0 to 20% of $B_2O_3$, 0 to 20% of MgO, 0 to 20% of CaO, 0 to 20% of SrO, 0 to 20% of BaO, 0.001 to 2% of $SnO_2$, 0 to 0.1% of $Sb_2O_3$, and 1 to 500 ppm of $Fe_2O_3$, has a mass ratio $SnO_2/(Fe_2O_3+SnO_2)$ of 0.95 or more, and has a difference between transmittances at a wavelength of 400 nm before and after irradiation with ultraviolet ray of 2% or less.

2. A glass substrate for a solar cell according to claim 1, wherein the glass composition further comprises 0 to 1% of $As_2O_3$.

3. A glass substrate for a solar cell according to claim 1, which has a glass composition comprising, in terms of mass %, 0 to 20% of a total amount of $Li_2O$, $Na_2O$, and $K_2O$.

4. A glass substrate for a solar cell according to claim 1, which is substantially free of $As_2O_3$.

5. A glass substrate for a solar cell according to claim 1, which has a transmittance of 90% or more at a plate thickness of 0.7 mm and at a wavelength of 400 nm to 1,000 nm.

6. A glass substrate for a solar cell according to claim 1, which has a density of 2.8 g/cm$^3$ or less.

7. A glass substrate for a solar cell according to claim 1, which has a thermal expansion coefficient at 30 to 380° C. of 37 to $100 \times 10^{-7}$/° C.

8. A glass substrate for a solar cell according to claim 1, which has a strain point of 500° C. or higher.

9. A glass substrate for a solar cell according to claim 1, which has a liquidus viscosity of $10^{4.0}$ dPa·s or more.

10. A glass substrate for a solar cell according to claim 1, which has a Young's modulus of 68 GPa or more.

11. A glass substrate for a solar cell according to claim 1, which is formed by an overflow down draw method.

* * * * *